United States Patent
Hutin et al.

(10) Patent No.: US 10,679,139 B2
(45) Date of Patent: Jun. 9, 2020

(54) QUANTUM DEVICE COMPRISING FET TRANSISTORS AND QUBITS CO-INTEGRATED ON THE SAME SUBSTRATE

(71) Applicant: COMMISSARIAT A L'ENERGIE ATOMIQUE ET AUX ENERGIES ALTERNATIVES, Paris (FR)

(72) Inventors: Louis Hutin, Grenoble (FR); Xavier Jehl, Grenoble (FR); Maud Vinet, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/284,103

(22) Filed: Feb. 25, 2019

(65) Prior Publication Data
US 2019/0266509 A1    Aug. 29, 2019

(30) Foreign Application Priority Data
Feb. 27, 2018    (FR) ...................... 18 51743

(51) Int. Cl.
| H01L 29/06 | (2006.01) |
| H01L 29/08 | (2006.01) |
| H01L 39/00 | (2006.01) |
| G06N 10/00 | (2019.01) |
| H01L 21/762 | (2006.01) |

(Continued)

(52) U.S. Cl.
CPC ....... *G06N 10/00* (2019.01); *H01L 21/76243* (2013.01); *H01L 21/823468* (2013.01); *H01L 27/088* (2013.01); *H01L 29/0653* (2013.01); *H01L 29/08* (2013.01); *H01L 29/66439* (2013.01); *H01L 29/66984* (2013.01); *H01L 29/7613* (2013.01); *H01L 29/66977* (2013.01)

(58) Field of Classification Search
USPC .......................................... 257/30
See application file for complete search history.

(56) References Cited

U.S. PATENT DOCUMENTS

| 2016/0268406 A1 | 9/2016 | Barraud et al. |
| 2017/0288076 A1 | 10/2017 | Andreev et al. |
| 2019/0123183 A1* | 4/2019 | Hutin ................ H01L 29/66484 |

OTHER PUBLICATIONS

U.S. Appl. No. 15/967,778, filed May 1, 2018, 2018/0331108 A1, Lous Hutin, et al.

(Continued)

*Primary Examiner* — Niki H Nguyen
(74) *Attorney, Agent, or Firm* — Oblon, McClelland, Maier & Neustadt, L.L.P.

(57) ABSTRACT

Quantum device comprising:
a quantum component forming a qubit, formed in an active layer of a substrate and comprising:
  a confinement region;
  charge carrier reservoirs;
  a first front gate covering the confinement region;
  first lateral spacers arranged around the first gate and covering access regions;
an FET transistor formed in the active layer, comprising channel, source and drain regions formed in the active layer, a second front gate covering the channel region, and second lateral spacers arranged around the second front gate and covering source and drain extension regions;
and wherein a width of the first lateral spacers is greater than that of the second lateral spacers.

14 Claims, 3 Drawing Sheets

(51) Int. Cl.
  *H01L 29/66* (2006.01)
  *H01L 29/76* (2006.01)
  *H01L 27/088* (2006.01)
  *H01L 21/8234* (2006.01)

(56) References Cited

OTHER PUBLICATIONS

U.S. Appl. No. 15/949,566, filed Apr. 10, 2018, 2018/0301479 A1, Ivan-Christophe Robin, et al.
U.S. Appl. No. 16/159,923, filed Oct. 15, 2018, Louis Hutin, et al.
U.S. Appl. No. 16/196,390, filed Nov. 20, 2018, Francois Andrieu, et al.
French Preliminary Search Report dated Oct. 26, 2018 in French Application 18 51743, filed on Feb. 27, 2018 (with English Translation of Categories of Cited Documents).
Weng, C., et al. "Feasible approach for processes integration of CMOS transistor gate/side-wall spacer patterning fabrication", Microelectronics and reliability, Elsevier Science, vol. 50, No. 12, 2010, 10 pages.
Maurand, R., et al. "A CMOS silicon spin qubit", Nature Communications, vol. 7, 2016, 6 pages.
Rotta, D., et al. "Maximum density of quantum information in a scalable CMOS implementation of the hybrid qubit architecture", Quantum Information Processing, Kluwer Academic, vol. 15, No. 6, 2016, 22 pages.
Veldhorst, M., et al. "Silicon CMOS architecture for a spin-based quantum computer", Nature Communications 8: 1766, 2017, 8 pages.

* cited by examiner

QUANTUM DEVICE COMPRISING FET TRANSISTORS AND QUBITS CO-INTEGRATED ON THE SAME SUBSTRATE

TECHNICAL FIELD AND PRIOR ART

The invention relates to the field of quantum devices, spintronics, quantum data processing and quantum computing.

A quantum device with one or a plurality of spin qubits, also known as "quantum bits" or "quantum dots", makes it possible to manipulate the quantum state of this or these qubits. Such a quantum device operates at low temperature, generally a few hundred mK. The spin qubits may be made in semiconductor, advantageously silicon.

A quantum device is controlled by control signals emitted by an electronic control circuit which is generally at a distance from the qubits and which is designed to operate at ambient temperature. This separation between the electronic control part and the part comprising the qubits is the source of multiple problems, particularly: management of the connections between these two parts, presence of parasitic passive elements, need to integrate attenuators and amplifiers close to the qubits.

In order to attempt a technological approach between the quantum part, i.e. the qubits, and the control part made with CMOS technology, the document "Silicon CMOS architecture for a spin-based quantum computer" by M. Veldhorst et al., Nature Communications 8: 1766, describes the production of qubits of a quantum device in a lower silicon level, and the production of the transistors of the control part in an upper silicon level. The assembly obtained forms a 3D architecture wherein the electronic control part is overlaid on the quantum part comprising the qubits. The structure proposed in this document is however difficult to produce due to particularly the alignment problems encountered for the production of the interconnections between the quantum part and the electronic control part.

DESCRIPTION OF THE INVENTION

There is therefore a need to propose a quantum device integrating on the same substrate one or a plurality of quantum components each forming a spin qubit, as well as one or a plurality of FET transistors (field-effect transistors) suitable to use to form at least a part of an electronic control circuit of this or these qubits.

For this, a quantum device is proposed comprising at least:
- a semiconductor on insulator type substrate comprising a buried dielectric layer arranged between a semiconductor active layer and a semiconductor support layer;
- a first quantum component forming a first qubit and comprising at least:
  - a first quantum confinement region formed by at least a first portion of the active layer;
  - first electric charge carrier reservoirs formed by second portions of the active layer between which the first portion of the active layer is arranged;
  - a first front gate covering at least the first portion of the active layer;
  - first lateral dielectric spacers arranged around the first front gate and covering third portions of the active layer which form first access regions each inserted between one of the second portions of the active layer and the first portion of the active layer;
- at least one FET transistor comprising channel, source and drain regions formed in the active layer, a second front gate covering at least the channel region, and second lateral dielectric spacers arranged around the second front gate and covering source and drain extension regions;

and wherein a width of the first lateral dielectric spacers is greater than that of the second lateral dielectric spacers.

More particularly, in a plane parallel with an interface between the active layer and the buried dielectric layer, the width of one or of each of the first lateral dielectric spacers may be greater than that of one or each of the second lateral dielectric spacers.

The structure of this device makes it possible to associate on the same substrate, for example for which the active layer includes silicon, one or a plurality of quantum components each forming a qubit and one or a plurality of FET transistors suitable for forming at least a part of an electronic control and/or reading circuit of this or these qubits.

In this quantum device, the co-integration of the quantum component(s) with one or a plurality of FET transistors on the same substrate is possible in that the width of the first lateral dielectric spacers of the first dielectric component(s) is decorrelated from that of the second lateral dielectric spacers of the FET transistor(s).

Indeed, in the or each of the FET transistors, the length of the source and drain extension regions, which corresponds to the distance between the channel region and each of the source and drain regions, is defined by the width of the second lateral dielectric spacers during the production of the FET transistor(s). The length of each of the source and drain extension regions is substantially equal to the width of the second lateral dielectric spacers. With a small width of the second lateral dielectric spacers, from which ensues a small length of the source and drain extension regions, the access resistances between the channel region and the source and drain regions of the or each of the FET transistors are minimised, which enables proper operation of the FET transistor(s).

The width of the second lateral dielectric spacers is described as "small" relative to the width of the first lateral dielectric spacers which is greater. The difference in width between the first and second spacers may particularly be such that the width of the first lateral dielectric spacers is at least 1.5 times greater than that of the second lateral dielectric spacers. In other words, the ratio between the width of the first lateral dielectric spacers and the width of the second lateral dielectric spacers may be greater than or equal to 1.5, or greater than or equal to 2.

On the other hand, in the or each of the quantum components forming a qubit, the length of the access regions, which corresponds to the distance between the confinement region and the electric charge carrier reservoirs, is defined by the width of the first lateral dielectric spacers during the production of the quantum component(s). The length of each of the access regions is substantially equal to the width of the first lateral dielectric spacers. With a large width of the first lateral dielectric spacers, from which ensues a large length of the access regions, the access resistances between the confinement region and the charge carrier reservoirs of the or each of the qubits is great in order to obtain proper operation of the quantum component(s). The width of the first lateral dielectric spacers is described as "large" relative to the width of the second lateral dielectric spacers which is lesser.

The length of each of the source and drain extension regions corresponds to the dimension which is parallel with the width of the second lateral dielectric spacers. Furthermore, the length of each of the access regions corresponds to the dimension which is parallel with the width of the first lateral dielectric spacers.

In this quantum device, a co-integration of the quantum part, formed by the quantum component(s), and of the peripheral electronic part, formed by the FET transistor(s), may be produced in the same VLSI ("Very-Large-Scale Integration") technology.

The integration carried out herein is monolithic and coplanar as the FET transistor(s) and the quantum component(s) forming the qubit(s) are integrated on the same substrate. These elements are further co-integrated on the same substrate in a coplanar manner.

The confinement region of a qubit corresponds to a region wherein an electric charge is intended to be trapped by forming a potential well below the front gate covering this confinement region, this potential well being delimited by the access regions covered by the lateral dielectric spacers surrounding the front gate.

The width of the first lateral dielectric spacers of a quantum component corresponds to the dimension of these spacers which is substantially parallel with the direction of flow of an electric charge between the electric charge carrier reservoirs and the confinement region of this quantum component. The width of the first lateral dielectric spacers corresponds also to the dimension of these spacers which is substantially perpendicular to the lateral edges of the first front gate against which these first spacers are arranged.

Similarly, the width of the second lateral dielectric spacers of an FET transistor corresponds to the dimension of these spacers which is substantially parallel with the direction of flow of the electric charges in the channel of this FET transistor. The width of the second lateral dielectric spacers corresponds also to the dimension of these spacers which is substantially perpendicular to the lateral edges of the second front gate against which these second spacers are arranged.

Herein and hereinafter in this document, the terms "first", "second", "third", "fourth", etc. are used to describe certain elements solely in an aim to distinguish them from one another, without presuming an order of production of these elements.

The first lateral dielectric spacers cover the third portions of the active layer, i.e. are arranged at least above the third portions of the active layer or are arranged at least against the top faces of the third portions of the active layer (the top faces of the third portions being those arranged on the side of the face of the active layer whereon the front gates are arranged). The first lateral dielectric spacers may be arranged also against other parts of the active layer.

The first front gate covers the first portion of the active layer, i.e. is arranged at least above the first portion of the active layer or is arranged at least against the top face of the first portion of the active layer (the top face of the first portion being that located on the side of the face of the active layer whereon the front gates are arranged).

The second front gate covers the channel region of the FET transistor, i.e. is arranged at least on top of the portion of the active layer forming this channel region or is arranged at least against the top face of the portion of the active layer (the top face of this portion of the active layer being that located on the side of the face of the active layer whereon the front gates are arranged).

The first and second dielectric spacers are described as "lateral" as they cover, or are arranged against, the lateral faces of the first and second front gates.

In view of the structure of the quantum component(s), such a quantum device may be produced with a technology derived from that of CMOS devices, which simplifies the production thereof.

Advantageously, the substrate may be of the FD-SOI ("Fully-Depleted Silicon On Insulator") type. With such a substrate, besides the best performances conferred upon FET transistor(s), the production of rear gates for the FET transistor(s) as well as coupling regions between several quantum components connected in series, from the rear face of these quantum components, is facilitated.

The quantum device may be such that:
the width of the first lateral dielectric spacers is between about 20 nm and 50 nm, and/or
the width of the second lateral dielectric spacers is between about 5 nm and 30 nm, and/or
the first and third portions of the active layer and/or the channel region of the FET transistor include a residual doping less than or equal to about $1.10^{16}$ at/cm$^3$, and/or
the second portions of the active layer and/or the source and drain regions of the FET transistor include a doping greater than or equal to about $1.10^{19}$ at/cm$^3$, and/or
the source and drain extension regions of the FET transistor include a doping between about $3.10^{18}$ at/cm$^3$ and $1.10^{19}$ at/cm$^3$.

Advantageously, the first front gate may further cover at least a part of the lateral edges of the first portion of the active layer. This configuration enables the quantum component to locate an electrically charged particle in one of the corners of the first portion which is covered by the first front gate, thus enhancing the confinement of the electric charge in the confinement region of the quantum component. This configuration offers superior control of the gate on the wave function, and is also advantageous in terms of coupling management and spin manipulation.

The FET transistor may include a rear gate formed by a first doped region of the support layer for which at least a part is arranged in vertical alignment with the channel region of the FET transistor and for which the doping level is greater than or equal to about $1.10^{19}$ at/cm$^3$. This configuration is advantageously produced when the substrate is FD-SOI type. Such a doping level makes it possible to prevent freezing of the charge carriers at low temperatures, for example a few mK, which corresponds to the temperature at which the quantum device is intended to operate.

The FET transistor may be electrically connected to the quantum component. This electrical connection is carried out when the FET transistor is part of the electronic control and/or reading circuit of the qubit(s) formed by the quantum component(s).

The quantum device may further include at least a second quantum component forming a second qubit and coupled with the first quantum component, comprising at least:
a second quantum confinement region formed by at least a fourth portion of the active layer;
a third front gate and third lateral dielectric spacers arranged around the third front gate,
and wherein:
one of the third portions of the active layer is covered by one of the first lateral dielectric spacers and by one of the third lateral dielectric spacers, is arranged between the first and second quantum confinement regions and forms a coupling region between the first and second quantum confinement regions;

the first and second quantum confinement regions are arranged between the first electric charge carrier reservoirs which are common to the first and second quantum components;

the support layer includes at least one second doped region for which at least a part is arranged in vertical alignment with the coupling region between the first and second quantum confinement regions and forms a rear control gate of the coupling between the first and second qubits.

In this configuration, the coupling between the confinement regions of the first and second qubits is adjustable by means of a tunnel barrier formed by the coupling region, the level of this tunnel barrier being adjustable according to the electric potential applied on the rear control gate of the coupling between the first and second qubits, i.e. the second doped region of the support layer which is located under this tunnel barrier and which acts by a field effect (due to the buried dielectric layer arranged between this second doped region and the coupling region) on the level of this tunnel barrier. The coupling region thus forms a barrier suitable for being lowered or raised by the rear control gate, according to the sought flow of the electric charges between the first and second quantum confinement regions.

In these two qubits thus coupled, there is no overlay of gates inducing a significant capacitive coupling between same since the front gates of these qubits are not overlaid on, or arranged in vertical alignment with, the second doped region of the support layer forming the rear control gate of the coupling between the quantum confinement regions of the first and second qubits. The capacitive coupling between the front gates of these qubits and the rear control gate is very low relative to that obtained in an FET transistor including front and rear gates overlaid and separated by a thin oxide.

The first and second qubits thus coupled are not comparable to CMOS transistors connected in series as a CMOS transistor requires a charge carrier reservoir on either side of the channel thereof (the source and drain regions). Two MOS transistors are interconnected in series by connecting necessarily one of the drain and source regions of one of the two transistors to one of the drain and source regions of the other of the two transistors. Herein, no charge carrier reservoir, formed by a strongly doped region, is arranged between the quantum confinement regions of the first and second qubits.

Furthermore, in a CMOS transistor, a rear gate serves to modulate the potential of the channel and is therefore located below, or in vertical alignment with, the channel and cannot be produced in a self-aligned manner relative to the front gate of the transistor. Herein, the second doped region formed in the support layer is arranged at least in part below, or in vertical alignment with, the coupling region between the first and second qubits and not below, or in vertical alignment with, one of the confinement regions of the first and second qubits.

This configuration comprising the first and second qubits thus coupled is advantageously produced in an FD-SOI type substrate.

The second doped region of the support layer may include a doping greater than or equal to about $1.10^{19}$ at/cm$^3$. Such a doping level makes it possible to prevent freezing of the charge carriers at low temperatures, for example a few mK, which corresponds to the temperature at which the quantum device is intended to operate.

The width of each of the first and third lateral dielectric spacers may be greater than approximately half of a distance separating the first and third front gates.

The quantum device may further include electrical isolation trenches passing through at least the active layer and surrounding at least a first active zone including at least the first quantum component, and surrounding at least a second active zone including at least the FET transistor, the electrical isolation trenches surrounding the first active zone being at least partially void, and the electrical isolation trenches surrounding the second active zone being filled with at least one dielectric material. The void thus made in the electrical isolation trenches that surround the active zone wherein the quantum component(s) is located makes it possible to obtain superior control of the confined electric charges particularly in the corners of the confinement region(s) of this or these qubits. Furthermore, forming at least partially void isolation trenches is not obvious for a person skilled in the art as for lithographic performance reasons, it is generally preferable to retain a planar face, which is not the case in the presence of at least partially void isolation trenches.

The void parts of the isolation trenches may pass through a part of the thickness of the buried dielectric layer, for example such that a remaining thickness of the buried dielectric layer located below these void parts of the isolation trenches is equal to or greater than about 10 nm.

A method for producing a quantum device is also proposed, comprising at least the steps of:

producing, in a semiconductor on insulator type substrate comprising a buried dielectric layer arranged between a semiconductor active layer and a semiconductor support layer, at least one first front gate covering at least a first portion of the active layer intended to form a first quantum confinement region of at least a first quantum component forming a first qubit, and at least a second front gate covering at least a portion of the active layer intended to form a channel region of at least one FET transistor;

producing first lateral dielectric spacers around the first front gate and covering third portions of the active layer intended to form first access regions of the first quantum component, and second lateral dielectric spacers around the second front gate and covering portions of the active layer intended to form source and drain extension regions of the FET transistor;

producing first electric charge carrier reservoirs of the first quantum component in second portions of the active layer between which the first portion of the active layer is arranged and such that each of the third portions of the active layer is inserted between one of the second portions of the active layer and the first portion of the active layer, and source and drain regions of the FET transistor.

The first electric charge carrier reservoirs of the first quantum component and the source and drain regions of the FET transistor may be produced by carrying out at least one doping using the first and second front gates and the first and second lateral dielectric spacers as a mask so that dopants are not implanted in the regions covered by the first and second front gates and by the first and second lateral dielectric spacers.

The method may further include, prior to the production of the front gates, the production of electrical isolation trenches through the active layer, followed by a partial etching step of the isolation trenches arranged around the first quantum component.

The steps producing the first quantum component may form also at least a second quantum component forming a second qubit and coupled with the first quantum component, comprising at least:
- a second quantum confinement region formed by at least a fourth portion of the active layer;
- a third front gate and third lateral dielectric spacers arranged around the third front gate, the first and second quantum components being such that the first and second quantum confinement regions are arranged between the first electric charges carrier reservoirs which are common to the first and second quantum components, and the method may further include, between the production of the first, second and third front gates and the production of the first, second and third lateral dielectric spacers, a doping of at least one region of the support layer, for which at least a part is arranged in vertical alignment with one of the third portions of the active layer which is arranged between the first and second quantum confinement regions and intended to form a coupling region between the first and second quantum confinement regions, said region of the support layer forming a rear control gate of the coupling between the first and second qubits.

BRIEF DESCRIPTION OF THE FIGURES

The present invention will be understood more clearly on reading the description of examples of embodiments given merely by way of indication and not limitation making reference to the appended figures wherein.

Identical, similar or equivalent parts of the different figures described hereinafter bear the same reference numbers so as to facilitate the transition from one figure to another.

The different parts shown in the figures are not necessarily shown according to a uniform scale, to render the figures more legible.

The different options (alternative embodiments and embodiments) should be understood as not being mutually exclusive and may be combined with one another.

DETAILED DESCRIPTION OF PARTICULAR EMBODIMENTS

Figure 1:
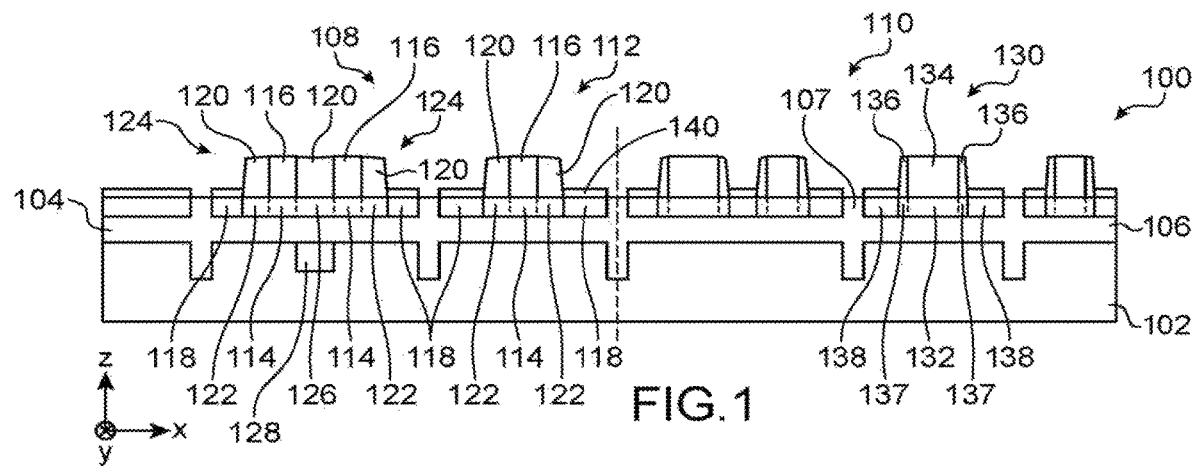
FIG. 1 shows a sectional view of a quantum device according to a first embodiment.

Reference is firstly made to FIG. 1 which shows a sectional view of a quantum device 100 according to a first embodiment.

The quantum device 100 is produced in a semiconductor on insulator, for example SOI (silicon on insulator), type substrate.

This substrate includes a semiconductor support layer 102, or bulk layer, and comprising for example silicon. The thickness of the support layer 102 is for example equal to several hundred microns.

The substrate also includes a semiconductor active layer 104, or superficial layer, and comprising for example silicon. The thickness of the active layer 104 is for example between about 5 nm and 30 nm.

Finally, the substrate also includes a buried dielectric layer 106, or BOX ("Buried Oxide"), arranged between the support layer 102 and the active layer 104. The buried dielectric layer 106 includes for example $SiO_2$. The thickness of the buried dielectric layer 106 is for example between about 20 nm and 145 nm.

Electrical isolation trenches 107, for example of the STI (shallow trench isolation) type are formed at least through the active layer 104 in order to electrically isolate from one another different regions of this active layer 104. In the example embodiment shown in FIG. 1, isolation trenches 107 also pass through the buried dielectric layer 106 as well as a part of the thickness of the support layer 102.

The quantum device 100 includes two parts integrated together on the substrate: a first part 108 comprising one or a plurality of quantum components each forming a spin qubit, and a second part 110 comprising one or a plurality of FET transistors for example used for controlling and/or reading the qubit(s). The first and second parts 108 and 110 are separated from one another, at least at the active layer 104, by at least one of the isolation trenches 107.

In one advantageous configuration, the second part 110 includes all the electronic components required, and particularly all the FET transistors, to form an electronic control and reading circuit of the qubit(s) formed in the first part 108.

In FIG. 1, the first part 108 comprises a quantum component 112 forming a spin qubit. This quantum component 112 comprises a quantum confinement region formed by a portion 114 of the active layer 104 and which corresponds to a region wherein an electric charge is intended to be confined, or trapped, by forming a potential well with respect to the portions of the active layer 104 peripheral to the portion 114.

The quantum component 112 also includes a front gate 116, for example formed from an electrically conductive portion and a gate dielectric inserted between the quantum confinement region formed by the portion 114 and the electrically conductive portion of the front gate 116. A control electric potential is for example intended to be applied on the front gate 116 so as to control (manipulation or reading control) the qubit formed by the quantum component 112.

The quantum component 112 also includes electric charge carrier reservoirs formed by portions 118 of the active layer 104 between which is located the portion 114 forming the quantum confinement region.

The quantum component 112 further includes lateral dielectric spacers 120 arranged around the front gate 116 and which cover portions 122 of the active layer 104 which form access regions inserted between the quantum confinement region and the electric charge carrier reservoirs of the qubit.

In the example shown in FIG. 1, the quantum component 112 forms an isolated qubit, i.e. for which the quantum confinement region is not coupled with the quantum confinement region of another qubit. In this quantum component 112, the portion 114 forming the quantum confinement region is juxtaposed to the two portions 122 forming the access regions. Each of the two portions 122 is further juxtaposed to one of the portions 118 forming the electric charge carrier reservoirs.

During the operation of the component 112, the number of charge carriers confined in the quantum dot formed by the portion 114 is controlled by the Coulomb blockade phenomenon obtained by applying an electric potential to the gate 116. Indeed, the electric potential applied to the gate 116 has the effect of lowering the chemical potential of the quantum dot defined in the portion 114, and thus enables the tunnel effect transmission of a charge carrier from the reservoirs 118. This event triggers in turn a change of chemical potential of the quantum dot, which renders the transport of the reservoirs to the quantum dot impossible until the charge carrier leaves the quantum dot.

The application of a magnetic field then makes it possible to separate spin states in energy, or "lift spin degeneracy". By working on one of the charge carriers, it is possible to switch from the low-energy state to that of higher energy by means of a resonant electromagnetic excitation. When the electromagnetic excitation energy is equal to the spin state separation, transitions are then possible. In practice, the separations are of the order of a few tens of $\mu eV$ (for a magnetic field of 0.1 T), therefore the absorption of microwave photons having frequencies of the order of a GHz is suitable (E=h*f where h is Planck's constant). The particle spin is coupled in the portion 114 with an ESR (Electron Spin Resonance) line which generates a magnetic field oscillating at the resonant frequency. When the conditions are combined (significant spin-orbit coupling), the gate 116 may be used to superimpose this microwave excitation on the confinement potential.

In the example embodiment shown in FIG. 1, the first part 108 also includes two other quantum components 124 corresponding to two spin qubits. Like the quantum component 112, each of the quantum components 124 comprises a confinement region formed by a portion 114 of the active layer 104 and topped by a front gate 116 surrounded by lateral dielectric spacers 120.

The two qubits formed by the two quantum components 124 are connected in series to one another via a portion 126 of the active layer 104 located between the portions 114 of the quantum components 124 and forming a coupling region between the confinement regions of these two qubits. Electric charge carrier reservoirs are formed by the portions 118 between which are located the portions 114 and 126, with access regions inserted between these reservoirs and the confinement regions and formed by the portions 122. The lateral dielectric spacers cover herein the portions 122 and 126 (on the portion 126, the lateral dielectric spacers of the two quantum components 124 are arranged against one another and together cover the portion 126).

For these two quantum components 124, the portion 126 forming the coupling region is juxtaposed to the two portions 114 forming the quantum confinement regions. Each of the two portions 114 is juxtaposed to one of the portions 122 forming the access regions, and each of the portions 122 is juxtaposed to one of the portions 118 forming the electric charge carrier reservoirs.

The quantum coupling between the quantum confinement regions of the two quantum components 124 embodied by the portion 126, and more particularly the level of the tunnel barrier formed by the portion 126 between these two quantum confinement regions can be changed by means of a doped region 128 of the support layer 102. A part of this region 128 is arranged in vertical alignment with, or facing, or below, the portion 126. Thus, the projection of this part of the region 128 in a plane parallel with the plane (X,Y) or parallel with the interface between the support layer 102 and the buried dielectric layer 106, is superimposed on the projection of the portion 126 in the same plane.

Furthermore, the region 128 is herein self-aligned relative to the front gates 116. Thus, by projecting the region 128 and the front gates 116 in the same plane parallel with the plane (X,Y), the edges of a part of the region 128 thus projected are aligned with those of the projection of the front gates 116 in this plane.

The semiconductor of the portions 114, 122 and 126 is not doped intentionally. Only a residual doping is present in the semiconductor of these portions, this residual doping corresponding for example to a dopant atom concentration for example less than or equal to about $1.10^{16}$ at/cm$^3$. The semiconductor of the portions 118 and of the region 128 is on the other hand strongly doped, for example with a dopant atom concentration greater than or equal to about $1.10^{19}$ at/cm$^3$, in order to prevent freezing of the charge carriers at low temperatures. The doping level of the region 128 is also sufficiently high such that the charging time (RC time) is low relative to the characteristic spin measurement time. Indeed, whereas at zero order a manipulation on the rear gate (charge reading or charge exchange) must be shorter than the time after which a spin loses the coherence thereof, the charging time is selected as short, for example of the order of about 1 ns, relative to the characteristic measurement time which is for example of the order of 100 ns. The dopants implanted in the semiconductor of the region 128 and of the portions 118 may be n or p type, the polarity of the implanted impurities can be compensated by the voltage applied to the region 128.

As a general rule, the region 128 corresponds to an electrically conductive doped region formed within the support layer 102, in the vicinity of the interface between the support layer 102 and the buried dielectric layer 106 so that it is close to the portion 126 forming the qubit coupling region.

In the quantum device 100, the region 128 is advantageously produced locally, self-aligned with respect to the different portions 114, 126 of the active layer 104 and the front gates 116, and therefore targeted with respect to the tunnel barrier for which the transparency, or the level, is intended to be modulated.

In this quantum device 100, according to the type of qubits formed (singlet triplet, single electron), the manipulation (singlet triplet) or reading control in each of the qubits formed by the quantum components 112, 124 may be carried out by means of the front gates 116. On the other hand, the communication between the two qubits formed by the two quantum components 124 is provided by the coupling region formed by the portion 126 and controlled by the region 128 which forms a rear control gate of this quantum coupling between the quantum confinement regions of these two qubits. This rear gate makes it possible to adjust the degree of coupling between the two quantum dots formed by the portions 114, via the adjustment of the tunnel barrier which separate them (tunnel barrier formed by the portion 126). According to the polarity applied on the region 128, this tunnel barrier may be reduced (strong coupling) or increased (weak coupling, high confinement), with a minimal coupling relative to the other tunnel junctions or front gates of the qubits.

Besides the first part 108 wherein the qubits of the quantum device 100 are produced, the quantum device 100 also includes, integrated in a coplanar manner on the substrate with the qubits of the first part 108, the second part 110 which comprises one or a plurality of FET transistors 130 serving advantageously for the control and/or reading of the quantum components) forming the qubits of the first part 108.

The or each of the FET transistors 130 includes a channel region 132 not intentionally doped whereon is arranged a front gate 134. This front gate 134 is surrounded by lateral dielectric spacers 136 which cover source and drain extension regions 137. The or each of the FET transistors 130 also includes source and drain regions 138 formed by doped portions of the active layer 106.

The quantum components 112, 124 forming the qubits are distinguished from the FET transistors 130 particularly by the lateral dielectric spacers 120 thereof which are wider than the lateral dielectric spacers 136 of the FET transistor(s) 130. Indeed, in an FET transistor 130, the portions of the active layer 106 located below the lateral dielectric spacers 120 correspond to the source and drain extension regions. The width of the lateral dielectric spacers 136 is for example between about 5 nm and 30 nm. The length of the front gate 134 is for example between about 10 nm and 10 µm. The width of the lateral dielectric spacers 136, which is substantially equal to the length of the source and drain extension regions 137 (dimensions parallel with the X axis shown in FIG. 1), is small to make it possible to minimise access resistances between the channel region and the source and drain regions. On the other hand, in the quantum components 112, 124 forming the qubits, the width of the lateral dielectric spacers 120, which is substantially equal to the length of the access regions 122 (dimension parallel with the X axis shown in FIG. 1) is greater, these access regions 122 having an electrical resistance greater than or equal to the von Klitzing constant, or at least 26 kΩ. For example, the width of the lateral dielectric spacers 120 is between about 20 nm and 50 nm. The length of the front gate 116 is for example between about 10 nm and 100 nm.

In the case of two quantum components forming qubits interconnected in series as is the case for the quantum components 124 shown in FIG. 1, the total width of the dielectric portion formed by the lateral dielectric spacers 120 located between the front gates 116 and which are bonded to one another is for example between about 20 nm and 60 nm. The inter-gate space and which corresponds to the spacing between the two adjacent front gates 116 of the two quantum components 124 and which is also equal to the length of the portion 126, is for example between about 20 nm and 60 nm. This inter-gate space is parallel with the gate length of each of the front gates 160, and therefore parallel with the X axis shown in FIG. 1. The width of each of the lateral dielectric spacers 120, which is herein parallel with the length of the front gates 116 and with the inter-gate space, is for example greater than half of the inter-gate space, and for example greater than about 10 nm. For example the inter-gate space may be equal to about 30 nm and the width of the lateral dielectric spacers may be equal to about 20 nm.

By way of example, the gate length (which corresponds to the dimension parallel with the X axis shown in FIG. 1) of each of the front gates 116, which corresponds also to the length of each of the portions 114, is between about 10 nm and 100 nm. This gate length corresponds to the dimension parallel with the direction of movement of the charge carriers between the portions 114.

The different zones of the active layer intended to be electrically contacted are for example covered with a silicide layer 140.

Though not visible in FIG. 1, the device 100 includes electrical interconnections connecting the FET transistor(s) 130 to the quantum components 112, 124 forming the qubits, which makes it possible to apply electric control and/or reading potentials on the different elements of the qubits. Thus, interconnections may connect the front gates 116 of the quantum components 112, 124 to the FET transistors 130 of the second part 110, so that these FET transistors 130 can apply electric control/reading potentials on these front gates 116. Further electrical contacts connected to the portions 118 may serve for controlling/reading the qubits. A further electrical contact may be connected to the control region 128, for example at a contact zone of the region 128 which is not arranged in vertical alignment with the portion 126, or in vertical alignment with the lateral dielectric spacers 120, so that this contact zone is accessible from the front face of the quantum device 100 by passing through the buried dielectric layer 106. These different electrical interconnections are for example produced in a back-end part of the quantum device 100 formed above the quantum components and the FET transistors, for example via one or a plurality of metallic layers structured and isolated from one another by inter-metal dielectric, or IMD, layers.

According to an alternative embodiment of the device 100 described above, it is possible that one or a plurality of doped semiconductor regions is arranged below the channel regions of the FET transistors 130, these regions including for example a similar doping level to that of the region 128. Such regions thus form rear gates of the FET transistors 130.

Figure 2:
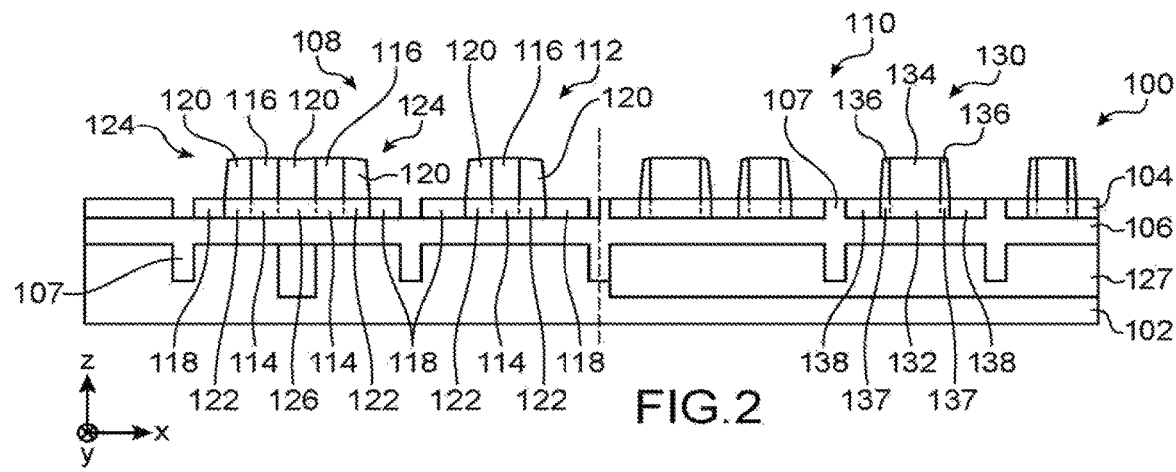
FIGS. 2 and 3 show sectional views of a quantum device according to a second embodiment.
Figure 3:
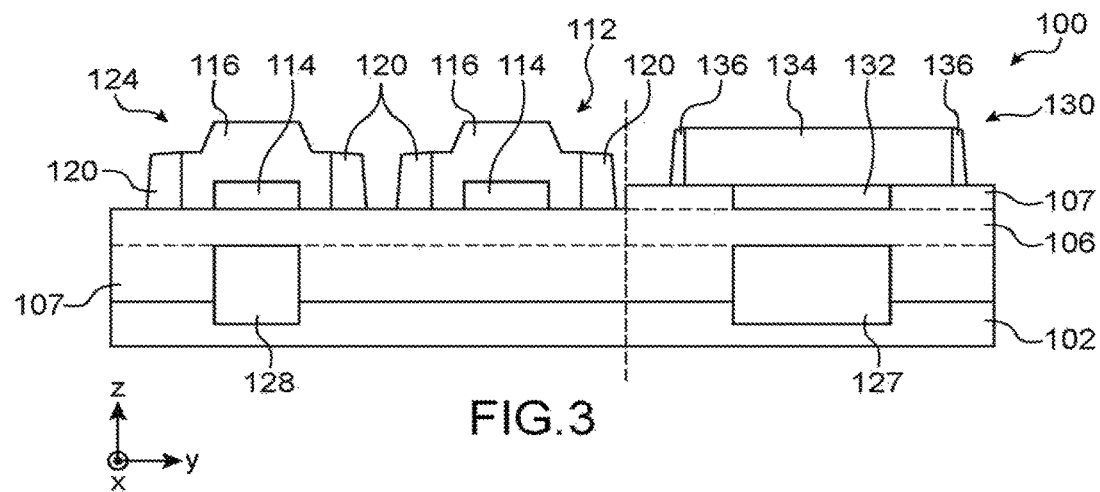

FIGS. 2 and 3 show sectional views of a quantum device 100 according to a second embodiment.

In this second embodiment, the isolation trenches 107 made in the second part 110, i.e. isolating the different active zones between the FET transistors 130, are similar to those made in the device 100 according to the first embodiment, i.e. made through the active layer 104, the buried dielectric layer 106 and a part of the support layer 102. On the other hand, in the first part 108 comprising the quantum components 112, 124 forming the qubits, the dielectric material of the isolation trenches 107 is not present at the active layer 106. In this first part 108 of the quantum device 100, the electrical isolation trenches 107 are at least partially void. Thus, the edges of the semiconductor portions 114 forming the qubit confinement regions are not in contact with the dielectric material of the isolation trenches 107, which makes it possible to increase the confinement of the charges in these confinement regions formed by the portions 114.

In this second embodiment, the FET transistors 130 further include a rear gate formed by a doped region 127 of the support layer 104 for which at least a part is arranged in vertical alignment with the channel regions 132 of these FET transistors 30. The doping level of this region 127 is for example greater than or equal to about $1.10^{19}$ at/cm$^3$.

Regardless of the embodiment of the device 100, the substrate used may be advantageously of the FD-SOI ("Fully-Depleted Silicon On Insulator") type.

Regardless of the embodiment of the quantum device 100, the front gates 116 of the quantum components 124, 112 forming the qubits of the quantum device 100 may correspond to partially covering gates, i.e. covering the top faces and at least a part of the lateral edges of the portions 114. This configuration makes it possible to enhance the corner effect sought in the portions 114, i.e. the confinement of the electric charges in the regions forming the corners of the portions 114. Such covering of the lateral edges of the portions 114 by the front gates can be seen in FIG. 3.

In the two embodiments described above, the quantum components 124 are coupled via the coupling region 126 and for which the coupling is controlled by the region 128. Alternatively, the quantum device 100 may not include such coupled qubits, but merely one or a plurality of isolated qubits similar to the quantum component 112. These qubits may however be electrically interconnected by electrical interconnections formed in the back-end part of the quantum device 100.

According to a further alternative embodiment, it is possible to couple a greater number of qubits with one another in pairs. In this case, a plurality of front gates 116 are produced next to one another, each covering particularly a portion 114 of the active layer 104 forming a confinement region of one of the qubits. A region 128 may in this case be produced in vertical alignment with all of the coupling regions 126 so as to modulate the coupling of all of these qubits simultaneously.

When the quantum device 100 includes more than two qubits coupled with one another, it is however advantageous to make the quantum device 100 such that the coupling carried out by each portion 126 can be modulated independently of one another by a plurality of independent, or separate, regions 128, each associated with one of the coupling portions 126. These different regions 128 are not in this case in contact with one another. For this, during the ion implantation of dopants in the support layer 102 to form these regions 128, it is possible to carry out beforehand an additional masking at the ends of the front gates so that parts of the support layer 102 receiving these dopants correspond merely to those located between the parts of the layer 102 arranged below the front gates 116. The implantation subsequently carried out forms the same number of regions 128 as coupling portions 126. These different regions 128 may be controlled independently of one another by means of the different electrical contacts subsequently produced and connected to each.

A method for producing the quantum device 100 according to the first embodiment is described hereinafter with reference to FIGS. 4 to 9.

Figure 4:
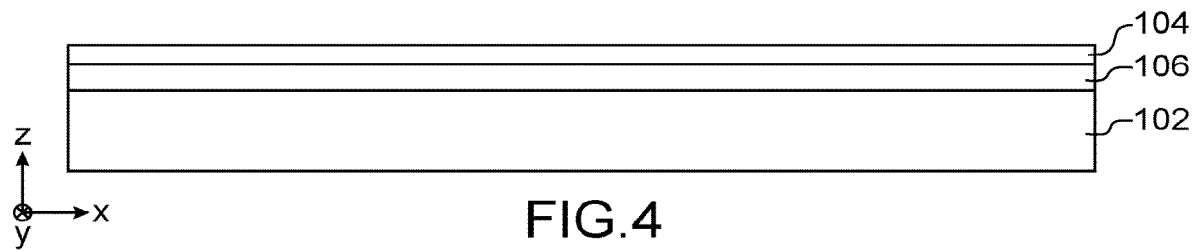
FIGS. 4 to 9 show the steps of a method for producing a quantum device according to the first embodiment.

As shown in FIG. 4, the method is carried out using the SOI substrate described above, i.e. comprising the support layer 102, the buried dielectric layer 106, and the semiconductor active layer 104.

The electrical isolation trenches 107 are then produced through the layer 104, the buried dielectric layer 106 and a part of the thickness of the support layer 102, which makes it possible to electrically isolate from each other the different active zones within the layer 104, and particularly the two parts 108, 110 of the quantum device 100.

Figure 5:
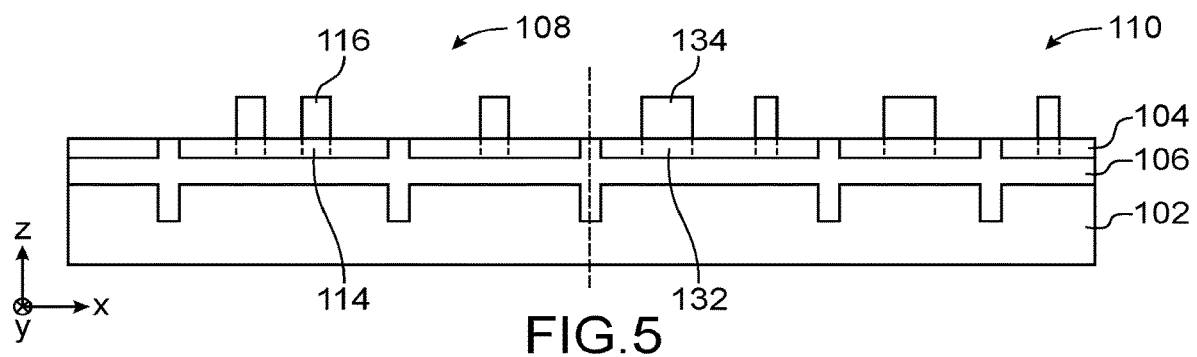

The front gates 116 and 134 are then produced on the active layer 104 (FIG. 5). The portions 114 of the active layer 104 covered by the front gates 116 correspond to the future quantum confinement regions of the qubits of the quantum device 100 and the portions 132 covered by the front gates 134 correspond to the future channel regions of the FET transistors of the quantum device 100. These front gates 116, 134 are produced by depositions of a dielectric gate material followed by a conductive gate material, then by an etching of these layers to form the gate dielectrics and the conductive gate portions. The shaping of these elements from deposited materials may be carried out by electron beam lithography, or indeed by deep UV/electron beam hybrid lithography, or by a plurality of deep UV type lithographic steps.

Figure 6:
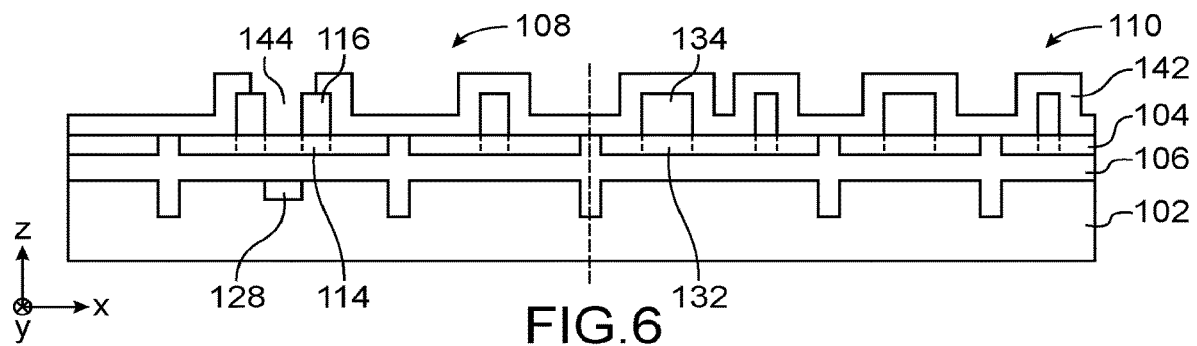

As shown in FIG. 6, a mask 142 is subsequently produced on the structure previously formed, in order to delimit, with the front gates 116 of the quantum components 124 intended to be coupled in series, the region 128 of the support layer 102 intended to receive the implanted dopants. An opening 144 formed through the mask 142 delimits, with the front gates 116, this region 128. On the example in FIG. 6, the mask 142 covers partially the front gates 116 of the quantum components 124 so as to have the edges of these front gates 116 arranged facing one another and not covered by the mask 142 to enable the self-alignment of the region 128 with respect to these edges. The thickness of the mask 142 is chosen according to the material used and such that the dopants subsequently implanted do not pass through this mask 142. An ion implantation is then carried out so as to form the region(s) 128 in the support layer 102. The masking carried out by the mask 142 and the front gates 116 prevents the implantation of the dopants below this masking.

The dose and energy of the ion beams used for this implantation are adjusted so as not to render amorphous the semiconductor of the active layer 104 and implant no dopants, or very few dopants, in the active layer 104. The implantation parameters are chosen such that the distribution of the dopants implanted is maximal in the semiconductor of the support layer 102 located on the side of the rear interface of the buried dielectric layer 106, then forming the region 128 which, due to the doping level obtained, has an electrical conductivity corresponding to that of an electrically conductive material. The ion implantation carried out is such that the dopant concentration in the semiconductor of the active layer 104 remains less than or equal to about $1.10^{16}$ at·cm$^{-3}$, and that the dopant concentration in the semiconductor of the region 128 is greater than or equal to about $1.10^{19}$ at·cm$^{-3}$. For example, when the thickness of the buried dielectric layer 106 is equal to about 145 nm, the ion implantation may be carried out with a dose between about $1.10^{13}$ at·cm$^{2}$ and $5.10^{13}$ at·cm$^{2}$ and an energy between about 250 keV and 300 keV.

Figure 7:
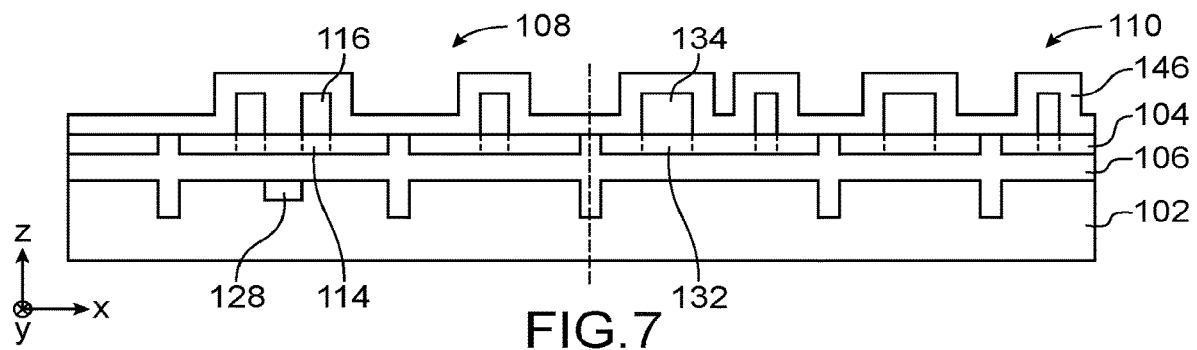

The mask 126 is then removed, then a dielectric layer 146 intended to produce the lateral dielectric spacers 120, 136 is deposited on the structure formed (FIG. 7). The dielectric layer 146 includes for example semiconductor nitride such as $Si_3N_4$. The thickness of the dielectric layer 146 is equal to the sought thickness of the lateral dielectric spacers 120 of the quantum components 112, 124.

Figure 8:
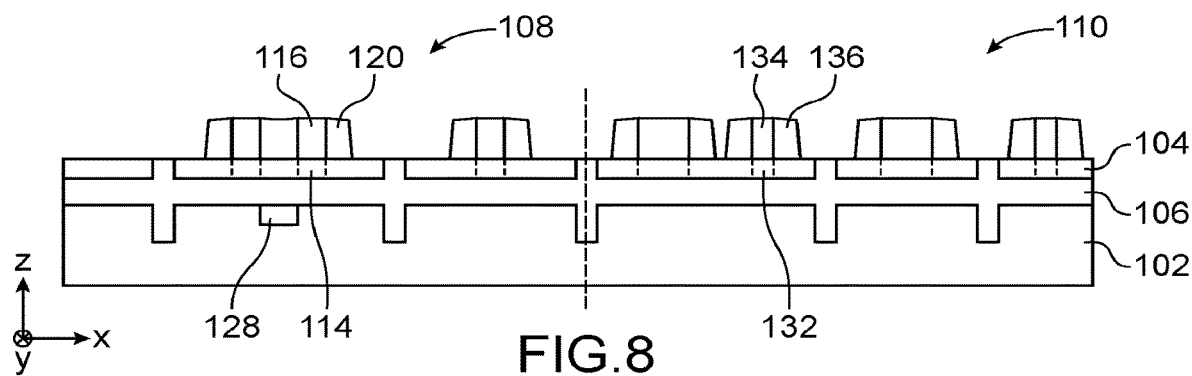
Figure 9:
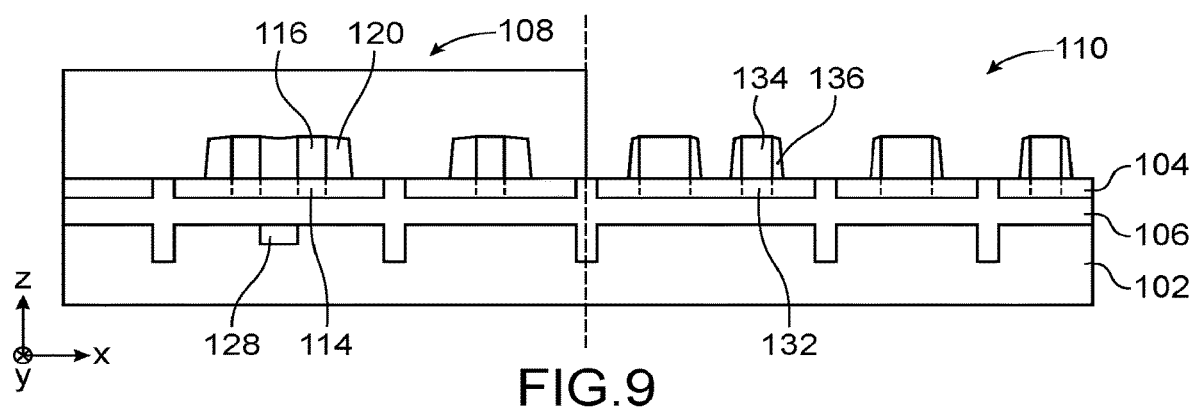

The layer 146 is then etched so that the remaining parts form the lateral dielectric spacers 120 and 136 (FIG. 8).

At this stage of the method, the lateral dielectric spacers 136 have the same width as the lateral dielectric spacers 120. In order to reduce the width of the lateral dielectric spacers 136 of the FET transistors, the first part 108 of the quantum device 100 is covered by a photosensitive resin 148, followed by a reduction in the width of the lateral dielectric spacers 136 is carried out for example by etching such as chemical etching, (for example with an HF solution), or reactive ion etching when the material of the lateral dielectric spacers 136 may be etched selectively with respect to the silicon of the active layer 104. Following this step, the lateral dielectric spacers 136 include the definitive width thereof which is less than that of the lateral dielectric spacers 120 (see FIG. 9).

The resin 148 is then removed. The quantum device 100 is then completed by carrying out the doping (in situ or ion implantation) of the portions 118, 138, with optionally epitaxy. The parameters of the ion implantation suitable for carrying out this doping are such that the dopants are only implanted in the semiconductor of these portions 118, 138 of the active layer 104 and not in the support layer 102, these parameters possibly corresponding to a dose between about $5.10^{14}$ at·cm$^{-2}$ and $5.10^{15}$ at·cm$^{-2}$ and an energy less than about 10 keV.

The structure obtained may then be encapsulated via the deposition of an encapsulation layer covering all the elements previously produced. Electrical contacts are then produced so as to form electrical accesses to the different portions 118, 138, to the front gates 116, 134 and to the region 128. The formation of silicide on the electrical contacts may also be carried out at this stage of the method.

When the electrical isolation trenches are at least partially void in the first part 108 of the quantum device 100 which includes the qubits (second embodiment described above), it is possible to carry out, between the production of the electrical isolation trenches 107 and the production of the front gates 116, 134, a deposition of resin on the part of the active layer 104 intended to form the second part 110, then etch at least partially the trenches 107 not covered by this resin either by chemical etching (for example BOE, or buffered oxide etch, etching carried with an HF-based buffered solution which is compatible with the resin covering the second part 110), or by dry etching (for example with etching reactors using ammonium salts for example SiCoNi type and the sublimation thereof). The dielectric thickness of the trenches 107 which is removed is for example between about 5 nm and 15 nm in order to leave a sufficient thickness of buried dielectric to prevent subsequent short-circuits during the other steps for producing the quantum device 100. Thus, the front gates 116 may be produced such that they cover, in addition to the top face of the portions 114, at least a part of the lateral edges of these portions 114 revealed by the etching of the isolation trenches 107.

The other steps of the method for producing the quantum device 100 described above are subsequently carried out to produce the quantum device 100 according to the second embodiment.

In the examples of embodiments described above, the front gates 116 are produced on the active layer 104 prior to the production of the doped regions 128. Alternatively, the front gates 116 may be produced after the regions 128. However, so that the regions 128 are indeed produced in a self-aligned manner with respect to these front gates, "dummy gates" may in this case be produced prior to the production of the regions 128, at the slots provided for the front gates 116. The doped regions 128 are then produced in a self-aligned manner with respect to these dummy gates. The lateral dielectric spacers 120 are then produced since these dummy gates are removed and replaced by the definitive front gates 116.

The invention claimed is:

1. Quantum device comprising at least:
a semiconductor on insulator type substrate comprising a buried dielectric layer arranged between a semiconductor active layer and a semiconductor support layer;
a first quantum component forming a first qubit and comprising at least:
a first quantum confinement region formed by at least a first portion of the active layer;
first electric charge carrier reservoirs formed by second portions of the active layer between which the first portion of the active layer is arranged;
a first front gate covering at least the first portion of the active layer;
first lateral dielectric spacers arranged around the first front gate and covering third portions of the active layer which form first access regions each inserted between one of the second portions of the active layer and the first portion of the active layer;
at least one FET transistor comprising channel, source and drain regions formed in the active layer, a second front gate covering at least the channel region, and second lateral dielectric spacers arranged around the second front gate and covering source and drain extension regions;
and wherein, in a plane parallel with an interface between the active layer and the buried dielectric layer, the width of one of the first lateral dielectric spacers is greater than that of one of the second lateral dielectric spacers.

2. Quantum device according to claim 1, wherein the substrate is FD-SOI type.

3. Quantum device according to claim 1, configured such that it includes at least one of the following features:
the width of the first lateral dielectric spacers is between about 20 nm and 50 nm,
the width of the second lateral dielectric spacers is between about 5 nm and 30 nm,
the first and third portions of the active layer include a residual doping less than or equal to about $1.10^{16}$ at/cm$^3$,
the channel region of the FET transistor includes a residual doping less than or equal to about $1.10^{16}$ at/cm$^3$,
the second portions of the active layer include a doping greater than or equal to about $1.10^{19}$ at/cm$^3$,
the source and drain regions of the FET transistor include a doping greater than or equal to about $1.10^{19}$ at/cm$^3$,
the source and drain extension regions of the FET transistor include a doping between about $3.10^{18}$ at/cm$^3$ and $1.10^{19}$ at/cm$^3$.

4. Quantum device according to claim 1, wherein the first front gate further covers at least a part of the lateral edges of the first portion of the active layer.

5. Quantum device according to claim 1, wherein the FET transistor includes a rear gate formed by a first doped region of the support layer for which at least a part is arranged in vertical alignment with the channel region of the FET transistor and for which the doping level is greater than or equal to about $1.10^{19}$ at/cm$^3$.

6. Quantum device according to claim 1, wherein the FET transistor is electrically connected to the quantum component.

7. Quantum device according to claim 1, further including at least a second quantum component forming a second qubit and coupled with the first quantum component, comprising at least:
a second quantum confinement region formed by at least a fourth portion of the active layer;
a third front gate and third lateral dielectric spacers arranged around the third front gate,
and wherein:
one of the third portions of the active layer is covered by one of the first lateral dielectric spacers and by one of the third lateral dielectric spacers, is arranged between the first and second quantum confinement regions and forms a coupling region between the first and second quantum confinement regions;
the first and second quantum confinement regions are arranged between the first electric charge carrier reservoirs which are common to the first and second quantum components;
the support layer includes at least one second doped region for which at least a part is arranged in vertical alignment with the coupling region between the first and second quantum confinement regions and forms a control rear gate of the coupling between the first and second qubits.

8. Quantum device according to claim 7, wherein the second doped region of the support layer includes a doping greater than or equal to about $1.10^{19}$ at/cm$^3$.

9. Quantum device according to claim 7, wherein the width of each of the first and third lateral dielectric spacers is greater than approximately half of a distance separating the first and third front gates.

10. Quantum device according to claim 1, further including electrical isolation trenches passing through at least the active layer and surrounding at least a first active zone including at least the first quantum component, and surrounding at least a second active zone including at least the FET transistor, the electrical isolation trenches surrounding the first active zone being at least partially void, and the electrical isolation trenches surrounding the second active zone being filled with at least one dielectric material.

11. Method for producing a quantum device, comprising at least the steps of:
producing, in a semiconductor on insulator type substrate comprising an buried dielectric layer arranged between a semiconductor active layer and a semiconductor support layer, at least one first front gate covering at least a first portion of the active layer intended to form a first quantum confinement region of at least a first quantum component forming a first qubit, and at least a second front gate covering at least a portion of the active layer intended to form a channel region of at least one FET transistor;
producing first lateral dielectric spacers around the first front gate and covering third portions of the active layer intended to form first access regions of the first quantum component, and second lateral dielectric spacers around the second front gate and covering portions of the active layer intended to form source and drain extension regions of the FET transistor;
producing first electric charge carrier reservoirs of the first quantum component in second portions of the active layer between which the first portion of the active layer is arranged and such that each of the third portions of the active layer is inserted between one of the second portions of the active layer and the first portion of the active layer, and source and drain regions of the FET transistor,
wherein, in a plane parallel with an interface between the active layer and the buried dielectric layer, the width of one of the first lateral dielectric spacers is greater than that of one of the second lateral dielectric spacers.

12. Method according to claim 11, wherein the first electric charge carrier reservoirs of the first quantum component and the source and drain regions of the FET transistor are produced by carrying out at least one doping using the first and second front gates and the first and second lateral dielectric spacers as a mask.

13. Method according to claim 11, further including, prior to the production of the front gates, the production of electrical isolation trenches through the active layer, followed by a partial etching step of the isolation trenches arranged around the first quantum component.

14. Method according to claim 11, wherein the steps producing the first quantum component form also at least a second quantum component forming a second qubit and coupled with the first quantum component, comprising at least:
a second quantum confinement region formed by at least a fourth portion of the active layer;
a third front gate and third lateral dielectric spacers arranged around the third front gate,
the first and second quantum components being such that the first and second quantum confinement regions are arranged between the first electric charges carrier reservoirs which are common to the first and second quantum components,
and further including, between the production of the first, second and third front gates and the production of the first, second and third lateral dielectric spacer, a doping of at least one region of the support layer, for which at least a part is arranged in vertical alignment with one of the third portions of the active layer which is arranged between the first and second quantum confinement regions and intended to form a coupling region between the first and second quantum confinement regions, said region of the support layer forming a rear control gate of the coupling between the first and second qubits.

* * * * *